US012743027B2

(12) United States Patent
Hench et al.

(10) Patent No.: US 12,743,027 B2
(45) Date of Patent: Sep. 22, 2026

(54) METHODS AND SYSTEMS FOR MODEL-LESS, SCATTEROMETRY BASED MEASUREMENTS OF SEMICONDUCTOR STRUCTURES

(71) Applicant: KLA Corporation, Milpitas, CA (US)

(72) Inventors: John Hench, Los Gatos, CA (US); Akshay Krishna, Ann Arbor, MI (US); Christopher Liman, San Jose, CA (US); Jeremy Smith, San Mateo, CA (US); Liang Yin, Fremont, CA (US); Hyowon Park, Milpitas, CA (US); Tianhan Wang, San Jose, CA (US); Boxue Chen, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 521 days.

(21) Appl. No.: 18/136,739

(22) Filed: Apr. 19, 2023

(65) Prior Publication Data

US 2024/0085321 A1 Mar. 14, 2024

Related U.S. Application Data

(60) Provisional application No. 63/404,973, filed on Sep. 9, 2022.

(51) Int. Cl.

*G01N 21/47* (2006.01)
*G01N 23/201* (2018.01)

(Continued)

(52) U.S. Cl.

CPC ....... *G03F 7/70655* (2023.05); *G01N 23/201* (2013.01); *G03F 7/70625* (2013.01);

(Continued)

(58) Field of Classification Search

USPC ................ 216/2–109; 438/1–982; 706/1–62, 706/900–912; 850/1–52

See application file for complete search history.

(56) References Cited

U.S. PATENT DOCUMENTS 5,608,526 A 3/1997 Piwonka-Corle et al.
5,859,424 A 1/1999 Norton et al.

(Continued)

FOREIGN PATENT DOCUMENTS

JP 2021-089215 A 6/2021

OTHER PUBLICATIONS

Lemaillet, Germer, Kline et al., "Intercomparison between optical and x-ray scatterometry measurements of FinFET structures" by Proc. SPIE, v.8681, p. 86810Q (2013).

(Continued)

*Primary Examiner* — Marcellus J Augustin
(74) *Attorney, Agent, or Firm* — Spano Law Group

(57) ABSTRACT

Methods and systems for performing model-less measurements of semiconductor structures based on scatterometry measurement data are described herein. Scatterometry measurement data is processed directly, without the use of a traditional measurement model. Measurement sensitivity is defined by the changes in detected diffraction images at one or more non-zero diffraction orders over at least two different illumination incidence angles. Discrete values of a scalar function are determined directly from measured images at each incidence angle. A continuous mathematical function is fit to the set of discrete values of the scalar function determined at each incidence angle. A value of a parameter of interest is determined based on analysis of the mathematical function. In some embodiments, the scalar function includes a weighting function, and the weighting values (Continued)

associated with weighting function are optimized to yield an accurate fit of the mathematical function to the scalar values.

22 Claims, 6 Drawing Sheets

(51) Int. Cl.
*G03F 7/00* (2006.01)
*G06T 7/00* (2017.01)

(52) U.S. Cl.
CPC ...... *G03F 7/706837* (2023.05); *G06T 7/0004* (2013.01); *G01B 2210/56* (2013.01); *G01N 2223/054* (2013.01); *G01N 2223/316* (2013.01); *G01N 2223/3306* (2013.01); *G01N 2223/3308* (2013.01); *G01N 2223/401* (2013.01); *G01N 2223/6116* (2013.01); *G01N 2223/645* (2013.01); *G06T 2207/30148* (2013.01)

(56) References Cited

U.S. PATENT DOCUMENTS

| | | | | |
|---|---|---|---|---|
| 6,023,338 | A | 2/2000 | Bareket | |
| 6,429,943 | B1 | 8/2002 | Opsal et al. | |
| 6,716,646 | B1 | 4/2004 | Wright et al. | |
| 6,778,275 | B2 | 8/2004 | Bowes | |
| 6,787,773 | B1 | 9/2004 | Lee | |
| 6,992,764 | B1 | 1/2006 | Yang et al. | |
| 7,242,477 | B2 | 7/2007 | Mieher et al. | |
| 7,321,426 | B1 | 1/2008 | Poslavsky et al. | |
| 7,406,153 | B2 | 7/2008 | Berman | |
| 7,478,019 | B2 | 1/2009 | Zangooie et al. | |
| 7,626,702 | B2 | 12/2009 | Ausschnitt et al. | |
| 7,656,528 | B2 | 2/2010 | Abdulhalim et al. | |
| 7,826,071 | B2 | 11/2010 | Shchegrov et al. | |
| 7,842,933 | B2 | 11/2010 | Shur et al. | |
| 7,873,585 | B2 | 1/2011 | Izikson | |
| 7,929,667 | B1 | 4/2011 | Zhuang et al. | |
| 7,933,026 | B2 | 4/2011 | Opsal et al. | |
| 8,040,511 | B1 * | 10/2011 | Krishnan | G01N 21/211 356/369 |
| 8,068,662 | B2 | 11/2011 | Zhang et al. | |
| 8,138,498 | B2 | 3/2012 | Ghinovker | |
| 9,291,554 | B2 | 3/2016 | Kuznetsov et al. | |
| 9,826,614 | B1 | 11/2017 | Bakeman et al. | |
| 9,857,291 | B2 * | 1/2018 | Kwak | G01N 21/274 |
| 9,885,962 | B2 | 2/2018 | Veldman et al. | |
| 9,915,522 | B1 | 3/2018 | Jiang et al. | |
| 10,013,518 | B2 | 7/2018 | Bakeman et al. | |
| 10,101,670 | B2 | 10/2018 | Pandev et al. | |
| 10,152,678 | B2 | 12/2018 | Pandev et al. | |
| 10,324,050 | B2 | 6/2019 | Hench et al. | |
| 10,352,695 | B2 | 7/2019 | Dziura et al. | |
| 10,458,912 | B2 * | 10/2019 | Chouaib | G01B 11/303 |
| 10,545,104 | B2 | 1/2020 | Hench et al. | |
| 10,775,323 | B2 | 9/2020 | Gellineau et al. | |
| 11,156,566 | B2 | 10/2021 | Zhao et al. | |
| 2003/0021465 | A1 | 1/2003 | Adel et al. | |
| 2007/0176128 | A1 | 8/2007 | Van Bilsen et al. | |
| 2007/0221842 | A1 | 9/2007 | Morokuma et al. | |
| 2009/0152463 | A1 | 6/2009 | Toyoda et al. | |
| 2011/0266440 | A1 | 11/2011 | Boughorbel et al. | |
| 2012/0292502 | A1 | 11/2012 | Langer et al. | |
| 2013/0208279 | A1 | 8/2013 | Smith | |
| 2013/0304424 | A1 | 11/2013 | Bakeman et al. | |
| 2014/0019097 | A1 | 1/2014 | Bakeman et al. | |
| 2014/0064445 | A1 | 3/2014 | Adler | |
| 2014/0111791 | A1 | 4/2014 | Manassen et al. | |
| 2014/0172394 | A1 | 6/2014 | Kuznetsov et al. | |
| 2014/0222380 | A1 | 8/2014 | Kuznetsov et al. | |
| 2014/0297211 | A1 | 10/2014 | Pandev et al. | |
| 2015/0046121 | A1 | 2/2015 | Dziura et al. | |
| 2015/0110249 | A1 | 4/2015 | Bakeman et al. | |
| 2015/0117610 | A1 | 4/2015 | Veldman et al. | |
| 2015/0204664 | A1 | 7/2015 | Bringoltz et al. | |
| 2015/0285749 | A1 | 10/2015 | Moncton et al. | |
| 2015/0300965 | A1 | 10/2015 | Sezginer et al. | |
| 2016/0010990 | A1 | 1/2016 | McGarry | |
| 2016/0202193 | A1 | 7/2016 | Hench et al. | |
| 2016/0320319 | A1 | 11/2016 | Hench et al. | |
| 2017/0069080 | A1 * | 3/2017 | Sezginer | G06T 7/0006 |
| 2017/0167862 | A1 | 6/2017 | Dziura et al. | |
| 2018/0106735 | A1 | 4/2018 | Gellineau et al. | |
| 2018/0113084 | A1 * | 4/2018 | Hench | G01N 23/201 |
| 2018/0129140 | A1 * | 5/2018 | Cramer | G03F 7/7085 |
| 2018/0328868 | A1 | 11/2018 | Bykanov et al. | |
| 2019/0017946 | A1 | 1/2019 | Wack et al. | |
| 2019/0293578 | A1 | 9/2019 | Gellineau | |
| 2020/0116655 | A1 | 4/2020 | Hench et al. | |
| 2020/0232909 | A1 * | 7/2020 | Atkins | G01N 21/47 |
| 2021/0207956 | A1 | 7/2021 | Shchegrov et al. | |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).

International Search Report mailed on Dec. 22, 2023, for PCT Application No. PCT/US2023/031580 filed on Aug. 31, 2023 by KLA Corporation, 4 pages.

* cited by examiner

METHODS AND SYSTEMS FOR MODEL-LESS, SCATTEROMETRY BASED MEASUREMENTS OF SEMICONDUCTOR STRUCTURES

CROSS REFERENCE TO RELATED APPLICATION

The present application for patent claims priority under 35 U.S.C. § 119 from U.S. provisional patent application Ser. No. 63/404,973, filed Sep. 9, 2022, the subject matter of which is incorporated herein by reference in its entirety.

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled with available measurements.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance. X-ray reflectometers also suffer from penetration issues that limit their effectiveness when measuring high aspect ratio structures.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps. In addition, these techniques require numerous iterations which introduce registration errors.

X-Ray Scatterometry systems have shown promise to address challenging measurement applications. Traditional X-Ray scatterometry measurement techniques employ indirect methods of measuring physical properties of a specimen under measurement. In some examples, a physics-based measurement model is created that attempts to predict raw measurement signals based on assumed values of one or more model parameters. The measurement model includes parameters associated with the metrology tool itself, e.g., system parameters and parameters associated with the specimen under measurement. When solving for parameters of interest, some specimen parameters are treated as fixed valued and other specimen parameters of interest are floated, i.e., resolved based on the raw measurement signals.

System parameters are parameters used to characterize the metrology tool. Exemplary system parameters include angle of incidence (AOI), azimuth angle, beam divergence, etc. Specimen parameters are parameters used to characterize the specimen (e.g., material and geometric parameters characterizing the structure(s) under measurement). For a thin film specimen, exemplary specimen parameters include refractive index, dielectric function tensor, nominal layer thickness of all layers, layer sequence, etc. For a CD specimen, exemplary specimen parameters include geometric parameter values associated with different layers, refractive indices associated with different layers, etc. For measurement purposes, the system parameters and many of the specimen parameters are treated as known, fixed valued parameters. However, the values of one or more of the specimen parameters are treated as unknown, floating parameters of interest.

In some examples, the values of the floating parameters of interest are resolved by an iterative process (e.g., regression) that produces the best fit between theoretical predictions and experimental data. The values of the unknown, floating parameters of interest are varied and the model output values are calculated and compared to the raw measurement data in an iterative manner until a set of specimen parameter values are determined that results in a sufficiently close match between the model output values and the experimentally measured values. In some other examples, the floating parameters are resolved by a search through a library of pre-computed solutions to find the closest match.

The indirect approach to estimating values of parameters of interest is difficult to implement due to the complexity of the measurement model required to adequately represent light scattered from a complex semiconductor structure. The measurement model must properly model both the device under measurement and the measurement system to adequately model the physical interaction between the two, i.e., the light scattered from the device under measurement. Generating an accurate measurement model is computationally costly and requires a significant amount of time. These costs are a significant barrier to broad adoption of scatterometry measurement techniques.

One promising method of X-Ray scatterometry involves extracting critical dimensions without a measurement model. In this approach, measurements of semiconductor structures are achieved by processing measurement data directly, without the use of a measurement model. This enables a significant reduction in measurement recipe development effort and faster measurements. Exemplary methods of direct measurement include U.S. Pat. No. 10,775,323 to Gellineau et al. and U.S. Pat. No. 10,545,104 to Hench et al., the contents of which are incorporated herein by reference in their entirety.

To further improve device performance, the semiconductor industry continues to focus on vertical integration, rather than lateral scaling. Thus, accurate measurement of complex, fully three dimensional structures is crucial to ensure viability and continued scaling improvements. Future metrology applications present challenges for metrology due to increasingly small resolution requirements, multi-parameter correlation, increasingly complex geometric structures including high aspect ratio structures, and increasing use of opaque materials. Thus, methods and systems for improved scatterometry based measurements are desired.

SUMMARY

Methods and systems for performing model-less measurements of semiconductor structures based on scatterometry measurement data are described herein. Scatterometry measurement data is processed directly, without the use of a measurement model. In general, the sensitivity of model-less scatterometry based measurements as described herein is defined by the changes in detected diffraction images at one or more non-zero diffraction orders over at least two different illumination incidence angles. Changes in diffraction images include changes in intensity, diffraction angle, or both. Thus, model-less scatterometry based measurements, as described herein, may be employed to estimate parameters of interest characterizing any semiconductor structure that scatters light in a non-specular manner.

In one aspect, discrete values of a scalar function are determined directly from measured images at each incidence angle. A continuous mathematical function is fit to the set of discrete values of the scalar function determined at each incidence angle. A value of a parameter of interest is determined based on analysis of the mathematical function, e.g., minimum value, maximum value, inflection point, etc.

In some embodiments, the scalar function includes an image filter and a weighting function. The image filter function scales the values of each pixel within a particular image. The weighting function scales the values of each image of a set of measured images collected at different orientations of the structure under measurement with respect to the incoming illumination beam.

In another further aspect, the weighting values associated with weighting function are optimized to yield an accurate fit of a mathematical function to the scalar values. In some examples, the mathematical function is parameterized by one or more parameters that directly correspond with a parameter of interest of the structure under measurement.

In some examples the weighting function, the image filter function, or both, are implemented to minimize or maximize signals from one dimensional scattering. In these examples, the weighting function, the image filter function, or both, are employed to disambiguate parameters associated with one-dimensional structures or two-dimensional structures.

In another further aspect, different exposure times are employed at different orientations of the structure under measurement relative to the incident illumination beam. In these examples, the differences in exposure time among images collected at different orientations is accommodated by normalizing the image data mathematically based on exposure time.

In another aspect, accurate model-less measurements of tilt are employed to improve system calibration, wafer shape models, and measurement of absolute wafer tilt.

In another aspect, initial model-less scatterometry based measurements of wafer tilt are performed, and the orientation of the wafer under measurement is repositioned to a desired orientation with respect to the incident illumination beam based on the measured wafer tilt. Subsequently, refined model-less measurements are performed at the desired orientation, or at desired incidence angles relative to the desired orientation, or both.

In some embodiments, a model-less measurement of the tilt indicates the angular misalignment between the incident illumination beam and a hole structure. After measurement of the misalignment, the AOI and Azimuth angles of the wafer with respect to the illumination beam are adjusted to more precisely align the illumination beam with the hole structure based on the measured tilt. After alignment of the illumination beam with the hole structure, one or more scattering images are collected and analyzed to estimate values of one or more critical dimensions of the hole structure.

In some examples, the square of a Bessel function is employed to determine the average critical dimension of the hole structure. In some examples, the square of a modified Bessel function is employed to determine the average shape of an elliptically shaped hole structure, typical of many memory structures.

In some embodiments, the AOI and Azimuth angles of the wafer with respect to the illumination beam are adjusted to precise incidence angles that are not aligned with the hole structure based on a model-less measurement of tilt. Scattering images are collected at the precise off-axis incidence angles and analyzed to estimate values of critical dimensions of the hole structure. In some examples, a sine cardinal function is employed to estimate the height of the measured hole structure. In some other examples, scattering images are collected at the precise off-axis incidence angles to estimate overlay, e.g., the relative positioning of a hole structure and a contact layer below the hole.

In general, model-less scatterometry measurements may be employed to measure tilt of multiple structural elements of a measured target captured in a collected scatterometry image. In these examples, model-less techniques are applied to estimate values of parameters of interest characterizing a number of different structural elements based on collected diffraction signals located in spatially distinct regions of the detector.

Although the measurement of tilt of a semiconductor structure is often based on the identification of an individual peak in value of the mathematical function fit to the locus of scalar values derived from the collected images, in general, multiple peak values may be identified to estimate values of parameters characterizing a semiconductor structure under measurement.

In another aspect, an initial measurement of a parameter of interest is performed using a model-less technique, and another set of measurements are specified based on the initial measurement. In some examples, the design of the subsequent set of measurements is based on the observed shape of the mathematical fit to the discrete values of the scalar function evaluated at each orientation.

In some examples, model-less measurements as described herein are employed to measure parameters of one or more structures that enable measurement system calibration parameters to be validated or updated. In some of these examples, the results of model-less measurements enable the calibration of the measurement tool employed to perform the model-less measurements. However, in some other examples, information from model-less measurements is used across multiple measurement tools. In one example, a model-less measurement of tilt is used to refine the results of optical measurements across multiple measurement tools.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Figure 1:
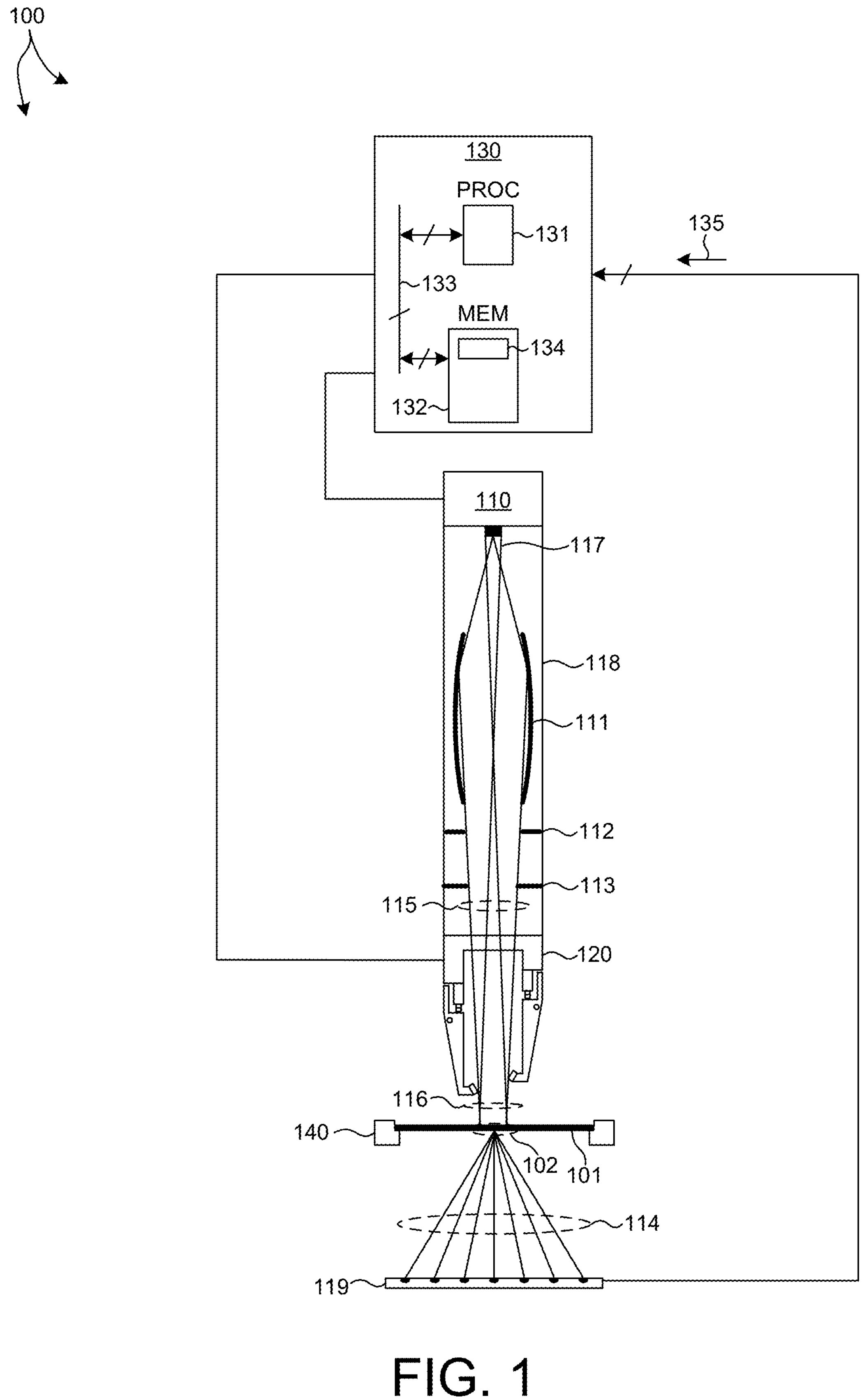
FIG. 1 is a diagram illustrative of a metrology system 100 configured to perform model-less measurements of semiconductor structures based on scatterometry measurement data in accordance with the methods described herein.

Reference will now be made in detail to background examples and some embodiments of the invention, examples of which are illustrated in the accompanying drawings.

Methods and systems for performing model-less measurements of semiconductor structures based on scatterometry measurement data are described herein. Measurements of semiconductor structures are achieved by processing scatterometry measurement data directly, without the use of a measurement model. Scatterometry measurements are performed over a range of incidence angles with respect to the structures under measurement. Detected images of light scattered from the structures under measurement include at least one higher diffraction order, i.e., one or more diffraction orders greater than the zero diffraction order.

In general, the sensitivity of model-less scatterometry based measurements as described herein is defined by the changes in detected diffraction images at one or more non-zero diffraction orders over at least two different illumination incidence angles. Changes in diffraction images include changes in intensity, diffraction angle, or both. Thus, model-less scatterometry based measurements, as described herein, may be employed to estimate parameters of interest characterizing any semiconductor structure that scatters light in a non-specular manner.

In one aspect, discrete values of a scalar function are determined directly from measured images at each incidence angle. A continuous mathematical function is fit to the set of discrete values of the scalar function determined at each incidence angle. A value of a parameter of interest is determined based on analysis of the mathematical function, e.g., minimum value, maximum value, inflection point, etc.

In another aspect, initial model-less scatterometry based measurements of wafer tilt are performed, and the orientation of the wafer under measurement is repositioned to a desired orientation with respect to the incident illumination beam based on the measured wafer tilt. Subsequently, refined model-less measurements are performed at the desired orientation, or at desired incidence angles relative to the desired orientation, or both. A value of a parameter of interest is determined based on the refined model-less measurement data.

Model-less scatterometry based measurements of semiconductor structures as described herein are employed to determine values of various parameters of interest, including, but not limited to: critical dimensions, tilt, average tilt, wafer bow, and other parametric measurements from scatterometry measurement data.

Measurements of semiconductor structures using model-less scatterometry techniques as described herein may be employed as part of a semiconductor fabrication process in a number of different ways. In some embodiments, model-less measurement results are employed directly to control a fabrication process. In some examples, measured values of one or more parameters of interest, e.g., critical dimensions, are directly employed to control one or more process parameters, e.g., focus, dosage, etch time, etc. In some embodiments, model-less measurement results are employed to improve the accuracy of a model based measurement. In some examples, model-less measurement results are employed to regularize a model based measurement, i.e., model-less measurement results are employed as part of one or more regularization terms in the regression analysis of a model based measurement. In some examples, model-less measurement results are employed to establish initial values of one or more floating parameters of a model based measurement. In some examples, model-less measurement results are employed to establish values of one or more fixed parameters of a model based measurement. In some embodiments, the model based measurement is performed on the same structure as measured by a model-less measurement technique. In some embodiments the model based measurement is performed on a different structure as measured by a model-less measurement technique. In some embodiments, the model based measurement results are employed to facilitate model based measurements performed by the same metrology system. In some other embodiments, the model based measurements are employed to facilitate model based measurements performed by a different metrology system. For example, model-less measurements performed by an X-Ray based scatterometry system may be employed to facilitate model based measurements performed by an optically based metrology system, e.g., spectral ellipsometer, spectral reflectometer, etc.

In some embodiments, the structures under measurement include some amount of periodicity to scatter light in discernable discrete diffraction orders. Diffraction from structures exhibiting periodicity in two dimensions appears as discrete points on the image plane of the detector. Diffraction from structures exhibiting periodicity in one dimension appears as discrete points on a line in the image plane of the detector.

In some embodiments, the structures under measurement are quasi-periodic in one or both in-plane dimensions. In these embodiments, the diffraction images exhibit continuous lines of diffracted light.

Figure 4:
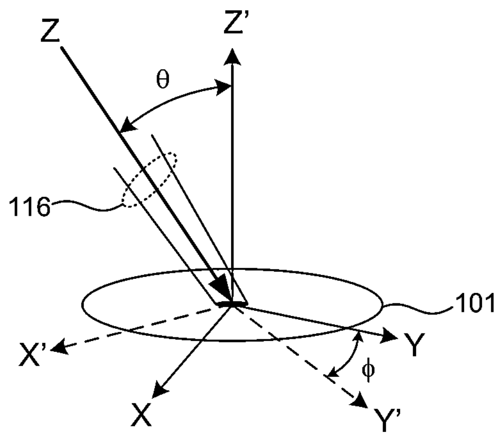
FIG. 4 depicts x-ray illumination beam 116 incident on wafer 101 at a particular orientation described by angles $\phi$ and $\theta$.

In general, model-less scatterometry based measurements as described herein may be employed to measure any semiconductor structure that exhibits periodicity or quasi-periodicity in one or both in-plane dimensions, e.g., the x-direction, the y-direction, or both, as depicted in FIG. 4.

Model-less scatterometry based measurements, as described herein, may be performed using narrowband illumination light centered about any suitable illumination wavelength, e.g., narrowband illumination light centered about any wavelength in the optical range, including ultraviolet, visible, and infrared ranges, any wavelength in the X-Ray range, or any wavelength in the infrared range. In preferred embodiments, the illumination light is narrow band with low beam divergence to reduce smearing of diffraction orders at the detector due to varying illumination wavelengths. Order separation on an X-Ray detector, specifically, is a function of wavelength, target periodicity, incidence angle, divergence angle of the uncollimated illumination light, detector resolution and distance from the target, etc. Nevertheless, in one dimension it is fundamentally governed by the diffraction equation, $d*\sin(\Delta\theta)=\lambda$, where d is the periodicity of the structure, $\lambda$ is the illuminating wavelength and $\Delta\theta$ is the angular spacing between orders. From this equation or the two dimensional equivalent, a practitioner skilled in the art may quickly determine the bandwidth and beam divergence required to resolve the individual orders on a detector.

In general, model-less scatterometry based measurements may be implemented by a wide variety of scatterometry based measurement systems employing narrow band illumination, including, but not limited to, X-Ray scatterometry based systems, including Small Angle X-Ray Scatterometry (SAXS) systems, angle resolved optical scatterometry systems, such as 1-D or 2-D Beam Profile Reflectometry (BPR) systems, etc.

Although useful measurements may be performed at two different incidence angles, in general, measurement sensitivity is improved by collecting measurement data over a large, diverse data set. This is achieved by collecting measurement data over a longer period of time, over a larger range of different illumination incidence angles, over a smaller spacing between different illumination incidence angles, or any combination thereof.

FIG. 1 illustrates an embodiment of a Transmission, Small-Angle X-Ray Scatterometry (T-SAXS) metrology tool 100 for measuring characteristics of a specimen in accordance with the exemplary methods presented herein. As shown in FIG. 1, the system 100 may be used to perform T-SAXS measurements over an inspection area 102 of a specimen 101 illuminated by an illumination beam spot.

In the depicted embodiment, metrology tool 100 includes an x-ray illumination source 110 configured to generate x-ray radiation suitable for T-SAXS measurements. In some embodiments, the x-ray illumination source 110 is configured to generate wavelengths between 0.01 nanometers and 1 nanometer. In general, any suitable high-brightness x-ray illumination source capable of generating high brightness x-rays at flux levels sufficient to enable high-throughput, inline metrology may be contemplated to supply x-ray illumination for T-SAXS measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110. In one example, an inverse Compton source available from Lyncean Technologies, Inc., Palo Alto, California (USA) may be contemplated. Inverse Compton sources have an additional advantage of being able to produce x-rays over a range of photon energies, thereby enabling the x-ray source to deliver x-ray radiation at different, selectable wavelengths.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. Focusing optics 111 focuses source radiation onto a metrology target located on specimen 101. The finite lateral source dimension results in finite spot size 102 on the target defined by the rays 117 coming from the edges of the source. In some embodiments, focusing optics 111 includes elliptically shaped focusing optical elements.

A beam divergence control slit 112 is located in the beam path between focusing optics 111 and beam shaping slit mechanism 120. Beam divergence control slit 112 limits the divergence of the illumination provided to the specimen under measurement. An additional intermediate slit 113 is located in the beam path between beam divergence control slit 112 and beam shaping slit mechanism 120. Intermediate slit 113 provides additional beam shaping. In general, however, intermediate slit 113 is optional.

Beam shaping slit mechanism 120 is located in the beam path immediately before specimen 101. In one aspect, the slits of beam shaping slit mechanism 120 are located in close proximity to specimen 101 to minimize the enlargement of the incident beam spot size due to beam divergence defined by finite source size. In one example, expansion of the beam spot size due to shadow created by finite source size is approximately one micrometer for a 10 micrometer x-ray source size and a distance of 25 millimeters between the beam shaping slits and specimen 101.

In some embodiments, beam shaping slit mechanism 120 includes multiple, independently actuated beam shaping slits (i.e., blades). In one embodiment, beam shaping slit mechanism 120 includes four independently actuated beam shaping slits. These four beams shaping slits effectively block a portion of incoming beam 115 and generate an illumination beam 116 having a box shaped illumination cross-section.

Figure 2:
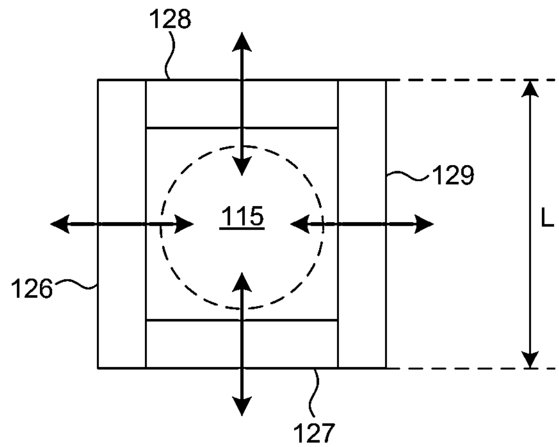
FIG. 2 depicts an end view of beam shaping slit mechanism 120 in one configuration.
Figure 3:
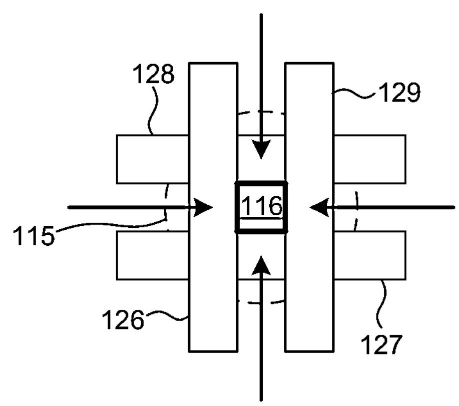
FIG. 3 depicts an end view of beam shaping slit mechanism 120 in another configuration.

FIGS. 2 and 3 depict an end view of beam shaping slit mechanism 120 depicted in FIG. 1 in two different configurations. As illustrated in FIGS. 2 and 3, the beam axis is perpendicular to the drawing page. As depicted in FIG. 2, incoming beam 115 has a large cross-section. In some embodiments, incoming beam 115 has a diameter of approximately one millimeter. Furthermore, the location of incoming beam 115 within beam shaping slits 126-129 may have an uncertainty of approximately three millimeters due to beam pointing errors. To accommodate the size of the incoming beam and the uncertainty of the beam location, each slit has a length, L, of approximately six millimeters. As depicted in FIG. 2, each slit is moveable in a direction perpendicular to the beam axis. In the illustration of FIG. 2, slits 126-129 are located at a maximum distance from the beam axis (i.e., the slits are fully open and they are not restricting the light passing through beam shaping slit mechanism 120.

In the embodiment depicted in FIG. 1, focusing optics 111, slits 112 and 113, and beam shaping slit mechanism 120 are maintained in a controlled environment (e.g., vacuum) within a flight tube 118.

FIG. 3 depicts slits 126-129 of beam shaping slit mechanism 120 in positions that block a portion of incoming beam 115, such that outgoing beam 116 delivered to the specimen under measurement has reduced size and well-defined shape. As depicted in FIG. 3, each of slits 126-129 has moved inward, toward the beam axis to achieve the desired output beam shape.

Slits 126-129 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit. In some embodiments, each slit has a rectangular cross-section having a width is approximately 0.5 millimeters and a height of approximately 1-2 millimeters. As depicted in FIG. 2, the length, L, of a slit is approximately 6 millimeters.

In general, x-ray optics shape and direct x-ray radiation to specimen 101. In some examples, the x-ray optics include an x-ray monochromator to monochromatize the x-ray beam that is incident on the specimen 101. In some examples, the x-ray optics collimate or focus the x-ray beam onto measurement area 102 of specimen 101 to less than 1 milliradian divergence using multilayer x-ray optics. In these examples, the multilayer x-ray optics function as a beam monochromator, also. In some embodiments, the x-ray optics include one or more x-ray collimating mirrors, x-ray apertures, x-ray beam stops, refractive x-ray optics, diffractive optics such as zone plates, Montel optics, specular x-ray optics such as grazing incidence ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

X-ray detector 119 collects x-ray radiation 114 scattered from specimen 101 and generates an output signals 135 indicative of properties of specimen 101 that are sensitive to the incident x-ray radiation in accordance with a T-SAXS measurement modality. In some embodiments, scattered x-rays 114 are collected by x-ray detector 119 while specimen positioning system 140 locates and orients specimen 101 to produce angularly resolved scattered x-rays.

In some embodiments, a T-SAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

In a further aspect, a T-SAXS system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals in accordance with model-less scatterometry techniques described herein.

It is desirable to perform measurements at large ranges of angle of incidence and azimuth angle to increase the precision and accuracy of measured parameter values. This approach reduces correlations among parameters by extending the number and diversity of data sets available for analysis to include a variety of large-angle, out of plane orientations. For example, in a normal orientation, T-SAXS is able to resolve the critical dimension of a feature, but is largely insensitive to sidewall angle and height of a feature. However, by collecting measurement data over a broad range of out of plane angular orientations, the sidewall angle and height of a feature can be resolved. In other examples, measurements performed at large ranges of angle of incidence and azimuth angle provide sufficient resolution and depth of penetration to characterize high aspect ratio structures through their entire depth.

Measurements of the intensity of diffracted radiation as a function of x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Each orientation of the illuminating x-ray beam 116 relative to the surface normal of a semiconductor wafer 101 is described by any two angular rotations of wafer 101 with respect to the x-ray illumination beam 115, or vice-versa. In one example, the orientation can be described with respect to a coordinate system fixed to the wafer. FIG. 4 depicts x-ray illumination beam 116 incident on wafer 101 at a particular orientation described by an angle of incidence, θ, and an azimuth angle, ϕ. Coordinate frame XYZ is fixed to the metrology system (e.g., illumination beam 116) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 4, x-ray illumination beam 116 is aligned with the Z-axis and thus lies within the XZ plane. Angle of incidence, θ, describes the orientation of the x-ray illumination beam 116 with respect to the surface normal of the wafer in the XZ plane. Furthermore, azimuth angle, ϕ, describes the orientation of the XZ plane with respect to the X'Z' plane. Together, θ and ϕ, uniquely define the orientation of the x-ray illumination beam 116 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

As illustrated in FIG. 1, metrology tool 100 includes a specimen positioning system 140 configured to both align specimen 101 and orient specimen 101 over a large range of angles of incidence and azimuth angle with respect the illumination beam 116. In some embodiments, specimen positioning system 140 is configured to rotate specimen 101 over a large range of angles of rotation (e.g., at least 60 degrees) aligned in-plane with the surface of specimen 101. In this manner, angle resolved measurements of specimen 101 are collected by metrology system 100 over any number of locations and orientations on the surface of specimen 101. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

Figure 5:
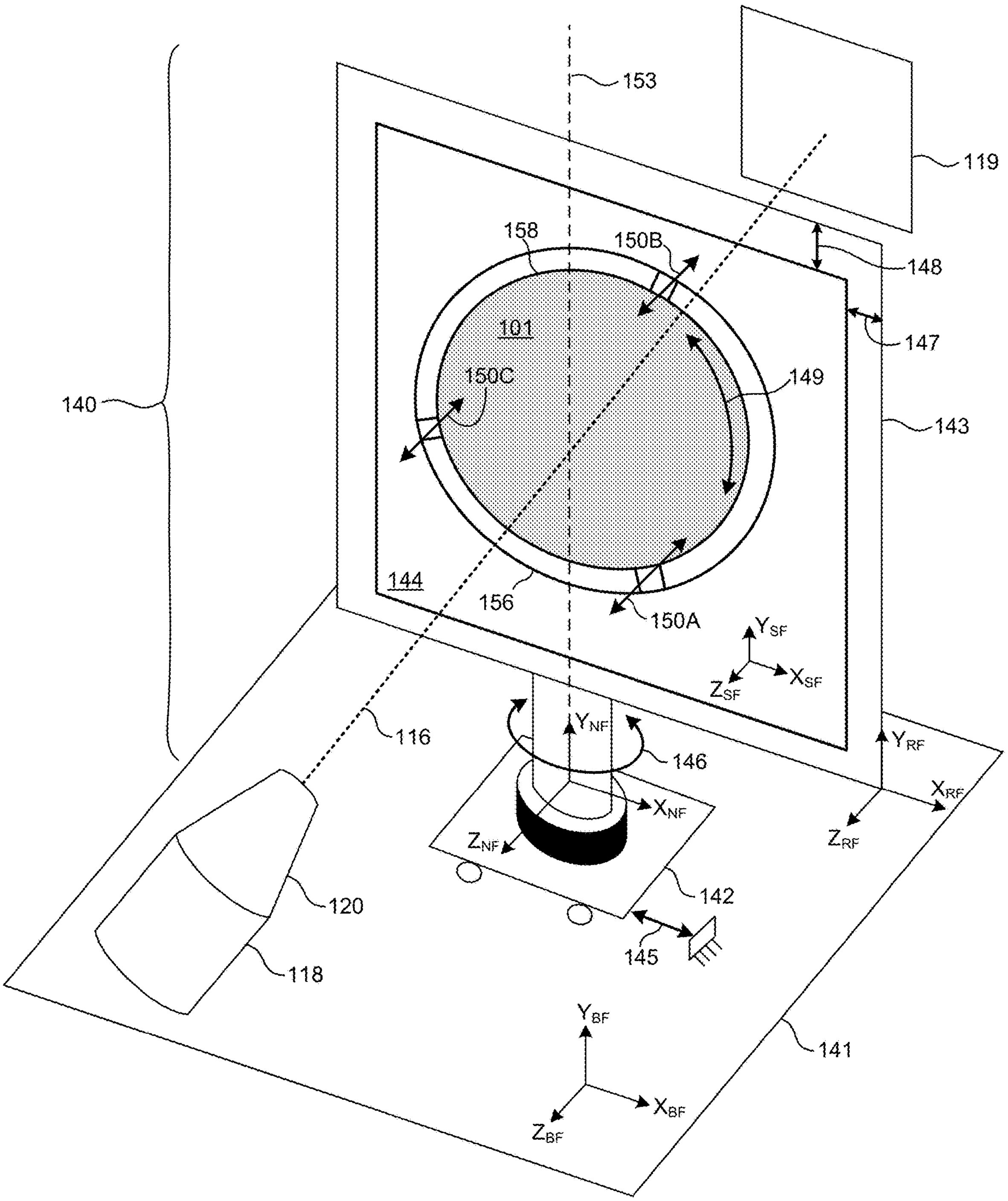
FIG. 5 is a diagram illustrative of a specimen positioning system 140 with the wafer stage moved to a position where the illumination beam 116 is incident on wafer 101.

FIG. 5 depicts a specimen positioning system 140 in one embodiment. As depicted in FIG. 5, specimen positioning system 140 includes a base frame 141, a lateral alignment stage 142, a stage reference frame 143, and a wafer stage 144. For reference purposes, the $\{X_{BF}, Y_{BF}, Z_{BF}\}$ coordinate frame is attached to base frame 141, the $\{X_N F, Y_{NF}, Z_{NF}\}$ coordinate frame is attached to lateral alignment stage 142, the $\{X_{RF}, Y_{RF}, Z_{RF}\}$ coordinate frame is attached to stage reference frame 143, and the $\{X_{SF}, Y_{SF}, Z_{SF}\}$ coordinate frame is attached to wafer stage 144. Wafer 101 is supported on wafer stage 144 by a tip-tilt-Z stage 156 including actuators 150A-C. A rotary stage 158 mounted to tip-tilt-Z stage 156 orients wafer 101 over a range of azimuth angles, θ, with respect to illumination beam 116. In the depicted embodiment, three linear actuators 150A-C are mounted to the wafer stage 144 and support rotary stage 158, which, in turn, supports wafer 101.

Actuator 145 translates the lateral alignment stage 142 with respect to the base frame 141 along the $X_{BF}$ axis. Rotary actuator 146 rotates the stage reference frame 143 with respect to lateral alignment stage 142 about an axis of rotation 153 aligned with the $Y_{NF}$ axis. Rotary actuator 146 orients wafer 101 over a range of angles of incidence, θ, with respect to illumination beam 116. Wafer stage actuators 147 and 148 translate the wafer stage 144 with respect to the stage reference frame 143 along the $X_{RF}$ and $Y_{RF}$ axes, respectively. Actuators 150A-C operate in coordination to translate the rotary stage 158 and wafer 101 with respect to the wafer stage 144 in the $Z_{SF}$ direction and tip and tilt rotary stage 158 and wafer 101 with respect to the wafer stage 144 about axes coplanar with the $X_{SF}$-$Y_{SF}$ plane. Rotary stage 158 rotates wafer 101 about an axis normal to the surface of wafer 101.

In summary, wafer stage 144 is capable of moving the wafer 101 with respect to the illumination beam 116 such that illumination beam 116 may be incident at any location on the surface of wafer 101 (i.e., at least 300 millimeter range in XRF and YRF directions). Rotary actuator 146 is capable of rotating the stage reference frame 143 with respect to the illumination beam 116 such that illumination beam 116 may be incident at the surface of wafer 101 at any of a large range of angles of incidence (e.g., greater than two degrees). In one embodiment, rotary actuator 146 is configured to rotate stage reference frame 143 over a range of at least sixty degrees. Rotary actuator 149 mounted to wafer stage 144 is capable of rotating the wafer 101 with respect to the illumination beam 116 such that illumination beam 116 may be incident at the surface of wafer 101 at any of a large range of azimuth angles (e.g., at least ninety degrees rotational range).

In some other embodiments, lateral alignment stage 142 is removed and stage reference frame 143 is rotated with respect to base frame 141 by rotary actuator 146. In these embodiments, the x-ray illumination system includes one or more actuators that move one or more optical elements of the x-ray illumination system that cause the x-ray illumination beam 116 to move with respect to the base frame 141, for example, in the $X_{BF}$ direction.

Although a specific embodiment is illustrated in FIG. 5, in general, specimen positioning system 140 may include any suitable combination of mechanical elements to achieve the desired linear and angular positioning performance, including, but not limited to goniometer stages, hexapod stages, angular stages, and linear stages.

In another further aspect, computing system 130 is configured to generate scalar signals associated with each measured scatterometry image, fit the discrete set of scalar signals to a mathematical function, and extract values of one or more parameters of interest based on one or more characteristics of the mathematical function. In the embodiment depicted in FIG. 1, computing system 130 is configured as a model-less measurement engine configured to implement model-less measurement functionality as described herein.

Figure 6:
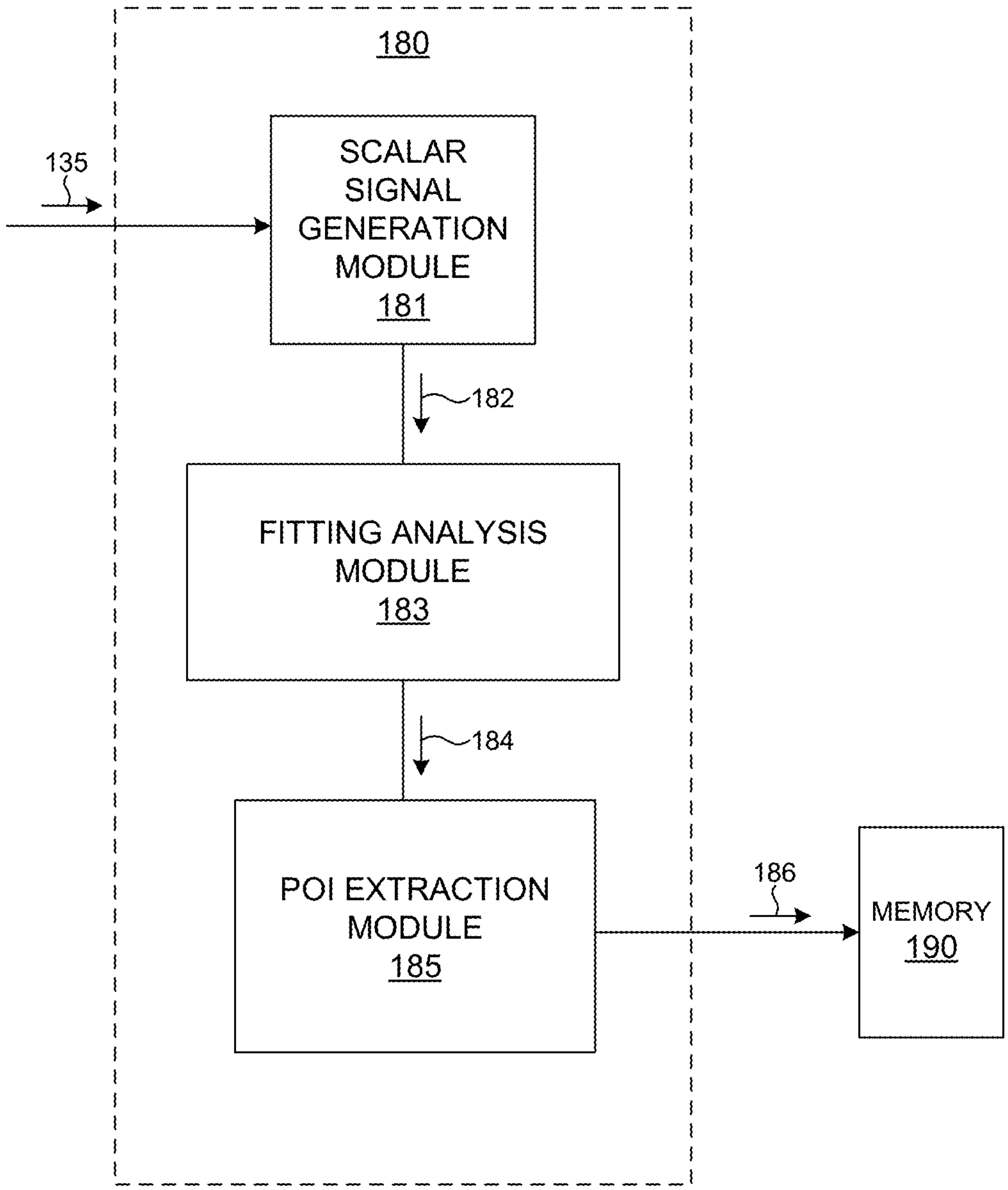
FIG. 6 is a diagram illustrative of an exemplary model-less measurement engine 180 configured to resolve specimen parameter values based on scatterometry data in accordance with the model-less methods described herein.

FIG. 6 is a diagram illustrative of an exemplary model-less measurement engine 180 implemented by computing system 130. As depicted in FIG. 6, model-less measurement engine 180 includes scalar signal generation module 181, fitting analysis module 183, and parameter of interest extraction module 185.

In one aspect, discrete values of a scalar function are determined directly from measured images 135 at each orientation, $\overline{\omega}$, of the structure under measurement with respect to the incoming illumination beam. In the example depicted in FIG. 4, an orientation is characterized by an angle of incidence (AOI), θ, and an azimuth angle, ϕ. In this example, a set of images is associated with different angles of incidence, different azimuth angles, or both. However, in general, the orientation of the structure under measurement with respect to the incoming illumination beam may be characterized by any suitable set of geometric parameters.

As depicted in FIG. 6, measured images 135 are communicated to scalar signal generation module 181. Scalar signal generation module 181 determines a scalar value associated with each captured image based on a scalar function. In some embodiments, the scalar function includes an image filter and a weighting function. The image filter function scales the values of each pixel within a particular image. The weighting function scales the values of each image of a set of measured images collected at different orientations of the structure under measurement with respect to the incoming illumination beam. In other words, the weighting function weighs images based on the measurement orientation, $\overline{\omega}$.

In one example, the scalar function, S, is described by Equation (1), where $I(\overline{\omega})$ is a measured image collected at orientation, $\overline{\omega}$. Q, is an image filter function operating on the pixels of each measured image, and P is a weighting function that operates on each measured image. In one example, image, I, is a vector of pixel values and image filter, Q, is a vector of coefficients with a one to one correspondence to each pixel of the captured image. In this manner, image filter, Q, scales each of the image pixel values by the corresponding coefficient of image filter, Q. In another example, image filter, Q, is a mathematical operator, e.g., a logarithm, a power function such as a square root, etc. applied to each pixel of the captured image. In another example, image filter, Q, is a scaling factor, e.g., a constant value, employed to scale the value of each pixel of the captured image. In general, image filter, Q, is any function that operates on each pixel of the captured image. The operation of image filter, Q, on each pixel of a captured image results is a vector of filtered pixel values.

P is a weighting function that operates on each vector of filtered pixel values. In general, the coefficients of weighting function, P, depend on the orientation, $\overline{\omega}$, of the structure under measurement with respect to the incident illumination beam. In one example, weighting function, P, is a scaling factor, e.g., a constant value, employed to scale the value of each pixel of a captured image, and the value of the scaling factor depends on the orientation of the structure under measurement with respect to the incident illumination beam associated with each particular captured image. In one example, each vector of filtered pixel values is multiplied element by element with a weighting coefficient associated with the particular combination of angle of incidence and azimuth angle associated with the measurement.

As illustrated by Equation (1), the resulting filtered and weighted pixel values associated with each collected image are summed to arrive at a scalar measurement value 182 associated each measured image 135.

$$S(\varpi, P) = \sum P(\varpi) \circ Q(I(\varpi)) \tag{1}$$

In a further aspect, a continuous mathematical function is fit to the set of discrete values 182 of the scalar function associated with the measured images collected at different orientations of the structure under measurement with respect to the incident illumination beam.

As depicted in FIG. 6, a set of discrete values 182 are communicated to fitting analysis module 183. Fitting analysis module 183 fits a continuous mathematical function 184 to the set of discrete values 182, and communicates the continuous mathematical function to parameter of interest (POI) extraction module 185. In some embodiments, the continuous mathematical function is a quadratic function. However, in general, any suitable mathematical function may be contemplated within the scope of this patent document.

In another further aspect, a value of a parameter of interest is determined based on an analysis of the continuous mathematical function 184. As depicted in FIG. 6, POI extraction module 185 analyzes continuous mathematical function 184 to extract values of one or more parameters of interest associated with parameters characterizing the continuous mathematical function, e.g., minimum value, maximum value, inflection point, a value where the first derivative of the mathematical function is zero, etc. The estimated value of each POI 186 is stored in a memory, e.g., memory 190.

In another further aspect, the weighting values associated with weighting function, P, are optimized to yield an accurate fit of a mathematical function to the scalar values. In some examples, the mathematical function is parameterized by one or more parameters that directly correspond with a parameter of interest of the structure under measurement.

In some examples, optimal weighting values associated with weighting array, P, are determined using an optimization procedure. For a fixed value of P, a critical dimension, q, is determined by the optimization of the fitting function, F, comprised of the curve function, C, parameterized by the vector, u, and the scalar function, S, for a set of orientations, $\overline{\varpi}$, as illustrated by Equation (2).

$$u^* = \underset{u}{\operatorname{argmin}}\|F(u, P)\|^2 - \mu_u\|u - u_0\|^2; \quad (2)$$
$$F(u, P) = C(\overline{\varpi}, u) - S(\overline{\varpi}, P)$$

An estimate of the scalar parameter of interest, q, is then extracted from the optimal value of the parameterization, u*, by the scalar reference functional r(u*,P). In one example, using bi-level optimization techniques, a higher level optimization may be employed to optimize a lower level optimization from which the critical dimensions are extracted. In this example, the bi-level optimization is expressed as an upper optimization illustrated by Equation (2) and a lower optimization illustrated by Equation (4) or Equation (5).

The upper optimization involves the optimization of a fitting functional, F, over multiple measurements. This is achieved by defining a reference functional, R, as a vector of critical dimension estimates, r, and U* as a collection of optimal values of the curve parameterization, u, as illustrated by Equation (3).

$$R(U^*, P) = [r(u_1^*) \;\; r(u_2^*) \;\; \ldots]; Q = [q_1 \;\; q_2 \;\; \ldots] \quad (3)$$

The upper level optimization then yields an optimal value of the weighting array, P* as illustrated by Equation (4).

$$P^* = \operatorname{argmin}_P\|R(U^*, P) - Q\|^2 + \mu_P\|P - P_0\| \quad (4)$$

To manage computational effort, this optimization may be evaluated over a lower dimensional parameterization of P, where P is the weighted sum of basis functions, B, with weighting, V. Under these conditions, in one example, Equation (4) is reformulated as illustrated by Equation (5).

$$P = \sum_i V_i B_i = V \cdot B; \quad (5)$$
$$P^* = V^* \cdot B;$$
$$V^* = \operatorname{argmin}_V\|R(U^*, V) - Q\|^2 + \mu_P\|V \cdot B - P_0\|$$

As illustrated in Equation (2), the curve function, C, depends on the vector of orientations, $\overline{\varpi}$, of the measurement and the parameters, u, characterizing the curve function. The fitting functional, F, fits a curve function, C, to the scalar function, S, by taking the argument of the weighting function, P, and the curve parameters, u, and minimizing their norm, e.g., the $L_2$ norm illustrated by Equation (2). In some examples, the optimization includes a regularization term. In the example illustrated by Equation (2), the regularization term includes the square of the distance between the current value of the curve parameterization, u, and an initial value of the weighting function, $u_0$, multiplied by a weighting coefficient, $\mu_\upsilon$.

In some examples, the optimization employed to solve for the mathematical function, C, illustrated by Equation (2) is weighted by the signal to noise ratio of measured images at each orientation. In this manner, measured images having the highest signal to noise ratio are weighted more heavily than those with relatively low signal to noise ratio.

The reference functional, R, matches the reference values of one or more POIs, Q, with the extraction functional, R(UI). The extraction function estimates the value of the POIs, Q, given the values of the curve fitting parameters, U. In some examples, the reference functional includes a regularization term. In the example illustrated by Equation (3) the regularization term includes the square of the distance between the current values, μ, of the parameters characterizing the curve function, C, and initial values, $\mu_\upsilon$), of the parameters as evaluated by the complement of the reference function, multiplied by a weighting coefficient, $\mu_\pi$.

In general, the initial values $u_0$ and $P_0$, may be treated as fixed values that are repeated for each iteration cycle, constant values that are updated at each iteration cycle based on the optimal results obtained from the previous iteration cycle, or a combination thereof.

In some other examples optimal weighting values associated with weighting function, P, are determined using a joint optimization in P and u. In these examples, the topology resembles a neural network and is amenable to back propagation.

In some examples, the parameter of interest is the tilt angle of a structure under measurement with respect to the incident illumination beam, e.g., tilt at a fixed azimuth angle.

In one of these examples a quadratic curve fitting function, illustrated by Equation (6), is fit to the discrete values of scalar function, S.

$$c(\theta, u) = u_0 + u_1\theta + u_2\theta^2 \quad (6)$$

Furthermore, an extraction function illustrated by Equation (7) is employed to extract the value of tilt, T, from the coefficients characterizing the quadratic curve fitting function.

$$T = r(u) = -u_1/2u_2 \quad (7)$$

The optimization identifies the values of the weighting function, P, such that the scalar signal curve, S, is as close to quadratic as possible. This is accomplished by taking the second derivative of the data as a function of orientation, using a finite difference operator. Then two quantities, U and V, are computed, where U is the second moment of the data on a per pixel basis and V the variance of the data on a per pixel basis. The ratio, W=V/U, provides an inverse measure of how closely the pixel signals fit to a quadratic function across the dataset. A pixel weighting value P is a function of the ratio, e.g., P=1−W/max(W).

Figure 7:
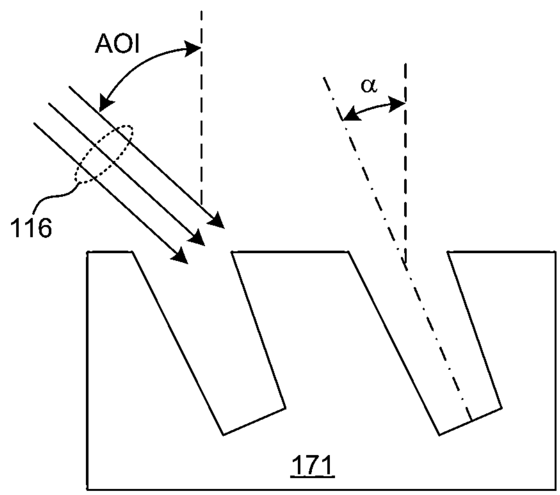
FIG. 7 depicts a tilted grating structure 171 measured by metrology system 100 at an angle of incidence, AOI.

As depicted in FIG. 7, a grating structure 171 is measured by T-SAXS system 100 at an azimuth angle of zero and at angle of incidence, AOI. As illustrated in FIG. 7, the grating structure itself is tilted at an oblique angle α, with respect to the surface of the wafer.

Figure 8:
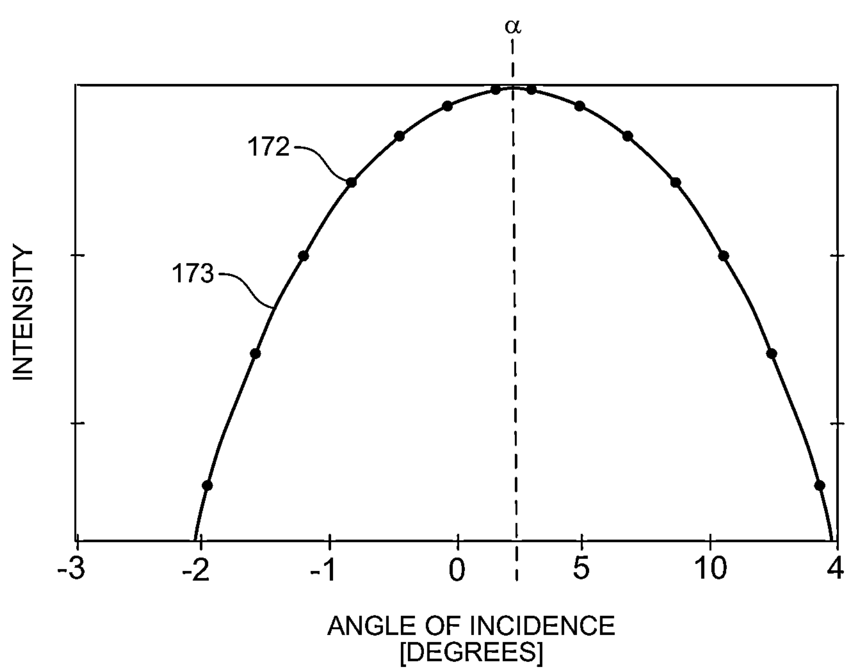
FIG. 8 depicts a plot indicative of discrete values 172 of a scalar function, S, operating on measured images at detector 119 collected at various angles of incidence, and a mathematical function 173 fit to the discrete values 172.

FIG. 8 depicts a plot indicative of discrete values 172 of a scalar function, S, operating on measured images at detector 119 collected at various angles of incidence. In addition, a mathematical function 173, i.e., curve, C, is fit to the discrete values 172. As depicted in FIG. 8, the maximum value of mathematical function 173 indicates the orientation of the grating structure 171 with respect to the incident illumination beam 116 where the incident illumination beam 116 is aligned with the holes of grating structure 171, i.e., zero tilt.

In some examples, weighting function, P, image filter function, Q, or both, are implemented to minimize or maximize signals from one dimensional scattering. In these examples, the weighting function, P, image filter function, Q, or both, are employed to disambiguate parameters associated with one-dimensional structures or two-dimensional structures.

In another further aspect, different exposure times are employed at different orientations of the structure under measurement relative to the incident illumination beam. In these examples, increased exposure time at particular orientations is employed to reduce measurement noise for a given amount of time required to estimate one or more parameters of interest. In other words, simply increasing exposure time at all orientations increases total measurement time required to estimate one or more parameters of interest. However, in some examples, the information content of the scalar signals is maximized by collecting image data over different time lengths at different orientations. In these examples, the differences in exposure time among images collected at different orientations is accommodated by normalizing the image data mathematically based on exposure time, e.g., scaling the measured pixel intensities across different images based on exposure time.

In another aspect, accurate model-less measurements of tilt are employed to improve system calibration, wafer shape models, and measurement of absolute wafer tilt.

In some embodiments, an AOI offset value is determined based on model-less measurements of tilt of a calibration grating at two azimuth angles separated by 180 degrees. In this manner, calibration of an AOI offset is decoupled from an angular offset of the target structure itself by measuring tilt over a range of angles of incidence and two azimuth angles separated by 180 degrees. In a similar manner, multiple tilt measurements enable the calibration of absolute wafer tilt.

In another aspect, model-less measurements of tilt are employed to define a subsequent set of measurements of a structure of interest. The subsequent set of measurements enables improved measurement accuracy, measurement of an expanded set of parameters of interest, or both. In some examples, the subsequent set of measurements enables improved measurement accuracy, measurement of an expanded set of parameters of interest, or both, when measuring deep hole memory structures.

In some embodiments, a model-less measurement of the tilt of a hole structure is performed as described herein. The measured tilt indicates the angular misalignment between the incident illumination beam and the hole structure. After measurement of the misalignment, the AOI and Azimuth angles of the wafer with respect to the illumination beam are adjusted to more precisely align the illumination beam with the hole structure based on the measured tilt. After alignment of the illumination beam with the hole structure, one or more scattering images are collected while the illumination beam is more precisely aligned with the hole structure. The measured scattering pattern is analyzed to estimate values of one or more critical dimensions of the hole structure.

In some examples, the square of a Bessel function is employed to determine the average critical dimension of the hole structure. When a beam of illumination beam is aligned with a circular hole structure, the pattern of scattered light captured at the detector is approximated by a Bessel function. Visually, the intensity pattern at the detector appears as a series of concentric rings. The larger the spacing between adjacent rings, the smaller the hole diameter, and vice-versa. In some examples, the square of a Bessel function is fit to the measured scattering pattern in an iterative manner. The values of the parameters characterizing the Bessel function fit to the measured scattering pattern directly correlate to the value of the critical dimension of the measured hole structure.

In some examples, the square of a modified Bessel function is employed to determine the average shape of an elliptically shaped hole structure, typical of many memory structures. If a hole structure is elliptical in cross-sectional shape, rather than circular, the scattering pattern varies from an ideal Bessel function. In these examples, an elliptical hole shape is modelled by a modified Bessel square function and transformed via a Fourier transform to predict the pattern of scattered light at the detector. In an iterative manner, the parameters describing the elliptical shape, e.g., major axis and minor axis magnitudes and orientation are tuned to match the predicted scattering pattern with the actual scattering pattern. In this manner, the shape and orientation of a non-circular hole structure are estimated with high accuracy.

In some embodiments, a model-less measurement of the tilt of a hole structure is performed as described herein. The measured tilt indicates the angular misalignment between the incident illumination beam and the hole structure. The AOI and Azimuth angles of the wafer with respect to the illumination beam are adjusted to precise incidence angles that are not aligned with the hole structure based on the measured tilt, i.e., precise off-axis angles. Scattering images are collected at the precise off-axis incidence angles. The measured scattering patterns are analyzed to estimate values of critical dimensions of the hole structure. In some examples, a sine cardinal function is employed to estimate the height of the measured hole structure. In some other examples, scattering images are collected at the precise off-axis incidence angles to estimate overlay, e.g., the relative positioning of a hole structure and a contact layer below the hole. Further details are described in U.S. Pat. No. 10,545,104 to KLA-Tencor Corporation (USA), the content of which is incorporated herein by reference in its entirety.

As described hereinbefore, model-less scatterometry measurements are employed to measure tilt of a hole structure. However, in general, model-less scatterometry measurements may be employed to measure tilt of multiple structural elements of a measured target captured in a collected scatterometry image. In some examples, a measured target includes multiple layers of hole structures, each characterized by a different tilt. In some of these examples, one layer has a stronger diffraction signal than another layer, e.g., an underlayer. In these examples, the stronger diffraction signal may appear away from the center of the image, while the weaker diffraction signals only appear near the center of the image. In these examples, the tilt associated with the stronger diffraction signals is determined by a model-less measurement associated with scatterometry signals near the edges of the image, and not signals near the center of the image. After determining the tilt associated with the stronger diffraction signals, the known tilt values are employed to estimate the tilt of the underlayer using model-less techniques based on the signals near the center of the image. In some examples, a measured target includes hole structures and word line cut structures, each characterized by a different tilt. In some of these examples, diffraction signals associated with the hole structures and diffraction signals associated with the word line cut structures appear in different regions of the collected image. In these examples, the tilt associated with the hole structures is determined by a model-less measurement technique based on signals in one region of the collected image, and the tilt associated with the word line cut structures is determined by a model-less measurement technique based on signals in a different region of the collected image.

Although the measurement of tilt of a semiconductor structure is often based on the identification of an individual peak in value of the mathematical function fit to the locus of scalar values derived from the collected images, in general, multiple peak values may be identified to estimate values of parameters characterizing a semiconductor structure under measurement. In some examples, scatterometry measurements of hole structures by a model-less technique results in two peak values of the mathematical function fit to the locus of scalar values derived from the collected images. In these examples, the hole structures are characterized by both a tilt and a taper, i.e., a change of critical dimension as a function of height. As a result, one peak is associated with the tilt associated with one side of the hole structure and the second peak is associated with the tilt associated with the opposite side of the hole structure. In this manner, the overall tilt of the hole structure and the taper of the hole structure are determined based on the values of the two peak values.

In some embodiments, a model-less measurement of the tilt of a hole structure is performed as described herein based on a relatively small set of images. The measured tilt indicates the angular misalignment between the incident illumination beam and the hole structure with relatively low precision. The AOI and Azimuth angles of the wafer with respect to the illumination beam are adjusted to precise incidence angles that are not aligned with the hole structure based on the measured tilt. Scattering images are collected at the precise off-axis incidence angles. The measured scattering patterns are analyzed to estimate values of tilt of the hole structure with relatively high precision.

In these embodiments, the initial estimation of hole tilt is performed with a relatively small set of images collected over a relatively short period of exposure time to minimize the amount of time required to estimate the hole tilt. Based on the initial estimate, another set of measurements are specified, e.g., the angles of incidence, azimuth angle, and exposure time, to maximize the precision of the tilt measurement relative to total measurement time. In some examples, the design of the subsequent set of measurements is based on a sensitivity analysis derived from initial geometric and electromagnetic modeling of the structure under measurement.

In some other examples, the design of the subsequent set of measurements is based on the observed shape of the mathematical fit to the discrete values of the scalar function evaluated at each orientation. In some examples, it is observed that signal information is the highest where the derivative of the mathematical function is the highest. In these examples, the subsequent set of measurements is designed to measure the structure at orientations clustered in regions of the mathematical function having the highest value of the first derivative, measure at these orientations for longer periods of time, or both. If different exposure times are employed at different orientations, the resulting images are normalized based on exposure time, e.g., the measured intensity at each pixel of each image is scaled by the exposure time associated with each image.

In some examples, a symmetric kernel is employed to fit data from measurements collected from a variety of incidence angles. However, in general, a number of different kernel functions may be employed to estimate a number of different tilt parameters, e.g., average tilt, wafer bow, etc.

In some examples, model-less measurements as described herein are employed to measure parameters of one or more structures that enable measurement system calibration parameters to be validated or updated.

In some of these examples, the results of model-less measurements enable the calibration of the measurement tool employed to perform the model-less measurements. However, in some other examples, information from model-less measurements is used across multiple measurement tools. In one example, a model-less measurement of tilt is used to refine the results of optical measurements, e.g., Mueller matrix elements, across multiple measurement tools.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray illumination source 110, beam shaping slit mechanism 120, specimen positioning system 140, and detector 119 in any manner known in the art. For example, the one or more computing systems 130 may be coupled to computing systems associated with the x-ray illumination source 110, beam shaping slit mechanism 120, specimen positioning system 140, and detector 119, respectively. In another example, any of the x-ray illumination source 110, beam shaping slit mechanism 120, specimen positioning system 140, and detector 119 may be controlled directly by a single computer system coupled to computer system 130.

The computer system 130 may be configured to receive and/or acquire data or information from the subsystems of the system (e.g., x-ray illumination source 110, beam shaping slit mechanism 120, specimen positioning system 140, detector 119, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 190) via a data link. For instance, spectral results obtained using detector 119 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, specimen parameter values 186 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 9:
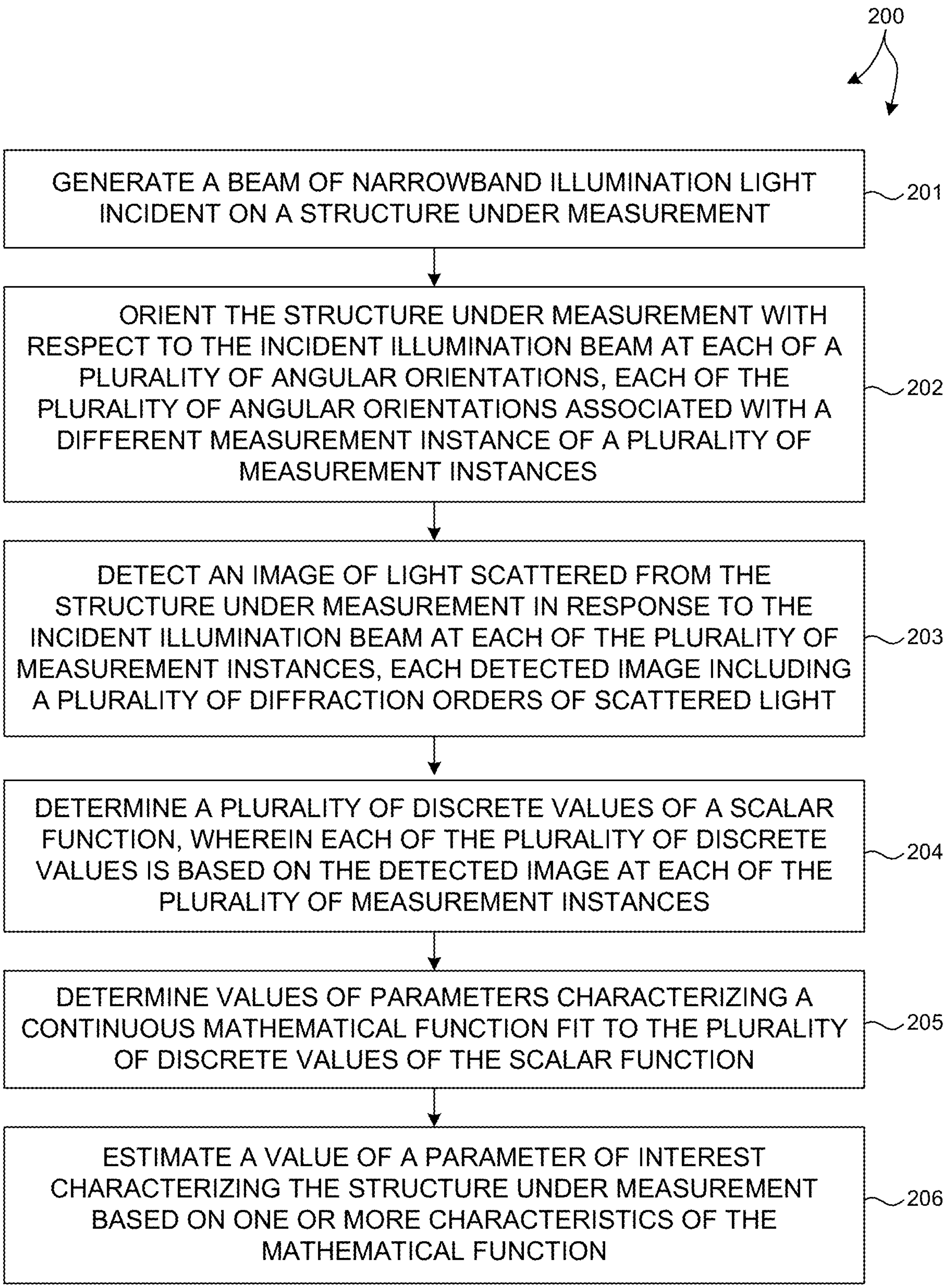
FIG. 9 depicts a flowchart illustrative of an exemplary method 200 of performing model-less measurements of semiconductor structures based on scatterometry measurement data as described herein.

FIG. 9 illustrates a method 200 suitable for implementation by the metrology system 100 of the present invention. In one aspect, it is recognized that data processing blocks of method 200 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 201, a beam of narrowband illumination light incident on a structure under measurement is generated by an illumination source.

In block 202, the structure under measurement is oriented with respect to the incident illumination beam at each of a plurality of angular orientations. Each of the plurality of angular orientations is associated with a different measurement instance of a plurality of measurement instances.

In block 203, an image of light scattered from the structure under measurement in response to the incident illumination beam is detected at each of the plurality of measurement instances. Each detected image includes a plurality of diffraction orders of scattered light.

In block 204, a plurality of discrete values of a scalar function is determined. Each of the plurality of discrete values is based on the detected image at each of the plurality of measurement instances.

In block 205, values of parameters characterizing a continuous mathematical function fit to the plurality of discrete values of the scalar function are determined.

In block 206, a value of a parameter of interest characterizing the structure under measurement is estimated based on one or more characteristics of the mathematical function.

In general, a metrology target is characterized by an aspect ratio defined as a maximum height dimension (i.e., dimension normal to the wafer surface) divided by a maximum lateral extent dimension (i.e., dimension aligned with the wafer surface) of the metrology target. In some embodiments, the metrology target under measurement has an aspect ratio of at least twenty. In some embodiments, the metrology target has an aspect ratio of at least forty.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a T-SAXS analysis are used to control a fabrication process. In one example, T-SAXS measurement data collected from one or more targets is sent to a fabrication process tool. The T-SAXS measurement data is analyzed as described herein and the results used to adjust the operation of the fabrication process tool.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with T-SAXS measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:

an illumination source configured to generate a beam of narrowband illumination light incident on a structure under measurement;

a specimen positioning system configured to orient the structure under measurement with respect to the incident illumination beam at each of a plurality of angular orientations, each of the plurality of angular orientations associated with a different measurement instance of a plurality of measurement instances;

an imaging detector configured to detect an image of light scattered from the structure under measurement in response to the incident illumination beam at each of the plurality of measurement instances, each detected image including a plurality of diffraction orders of scattered light; and a computing system configured to:

determine a plurality of discrete values of a scalar function, wherein each of the plurality of discrete values is based on the detected image at each of the plurality of measurement instances, wherein the scalar function includes a weighting function, wherein the weighting function scales the detected image at each of the plurality of measurement instances;

determine values of parameters characterizing a continuous mathematical function fit to the plurality of discrete values of the scalar function; and estimate a value of a parameter of interest characterizing the structure under measurement based on one or more characteristics of the mathematical function.

2. The metrology system of claim 1, wherein the scalar function includes an image filter, wherein the image filter scales values of each pixel within each detected image.

3. The metrology system of claim 2, wherein the scalar function is a mathematical operator.

4. The metrology system of claim 2, wherein the scalar function is a vector of coefficients with a one to one correspondence to each pixel of each detected image.

5. The metrology system of claim 1, wherein the continuous mathematical function is a quadratic function.

6. The metrology system of claim 1, wherein the one or more characteristics of the mathematical function includes a value of the mathematical function where a first derivative of the mathematical function is zero.

7. The metrology system of claim 1, the computing system further configured to:

optimize weighting values associated with the weighting function to fit the continuous mathematical function to the plurality of discrete values of the scalar function.

8. The metrology system of claim 1, wherein an exposure time of the structure under measurement to the incident illumination beam at one or more of the plurality of measurement instances is different from an exposure time associated with another measurement instance of the plurality of measurement instances.

9. The metrology system of claim 1, wherein the narrowband illumination light incident on the structure under measurement is centered in an x-ray range of the electromagnetic spectrum, an optical range of the electromagnetic spectrum, or an infrared range of the electromagnetic spectrum.

10. The metrology system of claim 1, wherein the structure under measurement is aperiodic or quasi-periodic.

11. A metrology system comprising:

an illumination source configured to generate a beam of narrowband illumination light incident on a structure under measurement;

a specimen positioning system configured to orient the structure under measurement with respect to the incident illumination beam at each of a first plurality of angular orientations and one or more of a second plurality of angular orientations, each of the first plurality of angular orientations associated with a different measurement instance of a first plurality of measurement instances, each of the one or more of the second plurality of angular orientations associated with a different measurement instance of one or more of a second plurality of measurement instances;

an imaging detector configured to detect an image of light scattered from the structure under measurement in response to the incident illumination beam at each of the first plurality of measurement instances and each of the one or more of the second plurality of measurement instances, each detected image including a plurality of diffraction orders of scattered light; and a computing system configured to:

estimate a value of tilt of the structure under measurement with respect to the incident illumination beam based on the detected images at each of the first plurality of measurement instances;

determine the one or more of the second plurality of orientations of the structure under measurement with respect to the incident illumination beam based on the measured tilt; and determine a value of a parameter of interest characterizing a shape of the structure under measurement based on the detected images at each of the one or more of the second plurality of measurement instances.

12. The metrology system of claim 11, wherein the one or more of the second plurality of orientations more precisely align the incident illumination beam with the structure under measurement relative to the first plurality of orientations.

13. The metrology system of claim 12, wherein the determining of the value of the parameter of interest characterizing the structure under measurement involves a iterative fit of a Bessel square function to the measured scattering pattern at the one or more of the second plurality of measurement instances.

14. The metrology system of claim 13, wherein the parameter of interest is a critical dimension of a hole structure.

15. The metrology system of claim 12, wherein the determining of the value of the parameter of interest characterizing the structure under measurement involves a iterative fit of a modified Bessel square function to the measured scattering pattern at the one or more of the second plurality of measurement instances.

16. The metrology system of claim 15, wherein the parameter of interest is a parameter characterizing a shape of an elliptically shaped hole structure, an orientation of the elliptically shaped hole structure, or both.

17. The metrology system of claim 11, wherein the one or more of the second plurality of orientations more precisely align the incident illumination beam at desired off-axis angles with respect to the structure under measurement relative to the first plurality of orientations.

18. The metrology system of claim 11, wherein the parameter of interest is any of a height of the structure under measurement or an overlay of the structure under measurement.

19. The metrology system of claim 11, wherein the first plurality of measurement instances is smaller than the second plurality of measurement instances.

20. The metrology system of claim 11, wherein the structure under measurement is aperiodic or quasi-periodic.

21. A method comprising:

generating a beam of narrowband illumination light incident on a structure under measurement;

orienting the structure under measurement with respect to the incident illumination beam at each of a plurality of angular orientations, each of the plurality of angular orientations associated with a different measurement instance of a plurality of measurement instances;

detecting an image of light scattered from the structure under measurement in response to the incident illumination beam at each of the plurality of measurement instances, each detected image including a plurality of diffraction orders of scattered light;

determining a plurality of discrete values of a scalar function, wherein each of the plurality of discrete values is based on the detected image at each of the plurality of measurement instances, wherein the scalar function includes a weighting function, wherein the weighting function scales the detected image at each of the plurality of measurement instances;

determining values of parameters characterizing a continuous mathematical function fit to the plurality of discrete values of the scalar function; and estimating a value of a parameter of interest characterizing the structure under measurement based on one or more characteristics of the mathematical function.

22. The method of claim 21, wherein the structure under measurement is aperiodic or quasi-periodic.

* * * * *